July 30, 1968 J. L. BOYER 3,395,321
COMPRESSION BONDED SEMICONDUCTOR DEVICE ASSEMBLY
Filed July 11, 1966 2 Sheets-Sheet 1

INVENTOR.
JOHN L. BOYER
BY
Ostrolenk, Faber, Gerb & Soffen
ATTORNEYS

INVENTOR.

JOHN L. BOYER

BY

Ostrolenk, Faber, Gerb & Soffen

ATTORNEYS

United States Patent Office 3,395,321

Patented July 30, 1968

3,395,321
COMPRESSION BONDED SEMICONDUCTOR DEVICE ASSEMBLY

John L. Boyer, El Segundo, Calif., assignor to International Rectifier Corporation, El Segundo, Calif., a corporation of California Filed July 11, 1966, Ser. No. 564,321
4 Claims. (Cl. 317—234)

ABSTRACT OF THE DISCLOSURE

A compression bonded semiconductor device in which the sealed wafer is placed atop a main conductive stud and is forced into engagement with the stud and with an adapter stud by means of an insulation cup. The insulation cup carries spring washers which bear against a shoulder in the adapter stud and force the adapter stud toward the main stud with the semiconductor device subassembly compressed therebetween. The insulation cup is secured to the main stud by a plurality of screws extending through axial openings through the wall of the insulation cup and are threaded into the main stud.

This invention relates to semiconductor devices, and more specifically relates to a novel assembly for housing semiconductor devices by compression bonding incorporating a novel cooling fin arrangement defining an integral heat sink device.

It is a primary object of this invention to provide a novel semiconductor device assembly which is inexpensive.

Another object of this invention is to provide a novel semiconductor device assembly having an integral heat sink which incorporates a low cost design using low cost materials.

Yet another object of this invention is to provide a novel semiconductor device assembly which can house and cool semiconductor devices having one or more junctions therein in a novel and simplified manner wherein the semiconductor device is easily removable and replaceable within the assembly.

These and other objects of this invention will become apparent from the following description when taken in connection with the drawings, in which.

Figure 3:
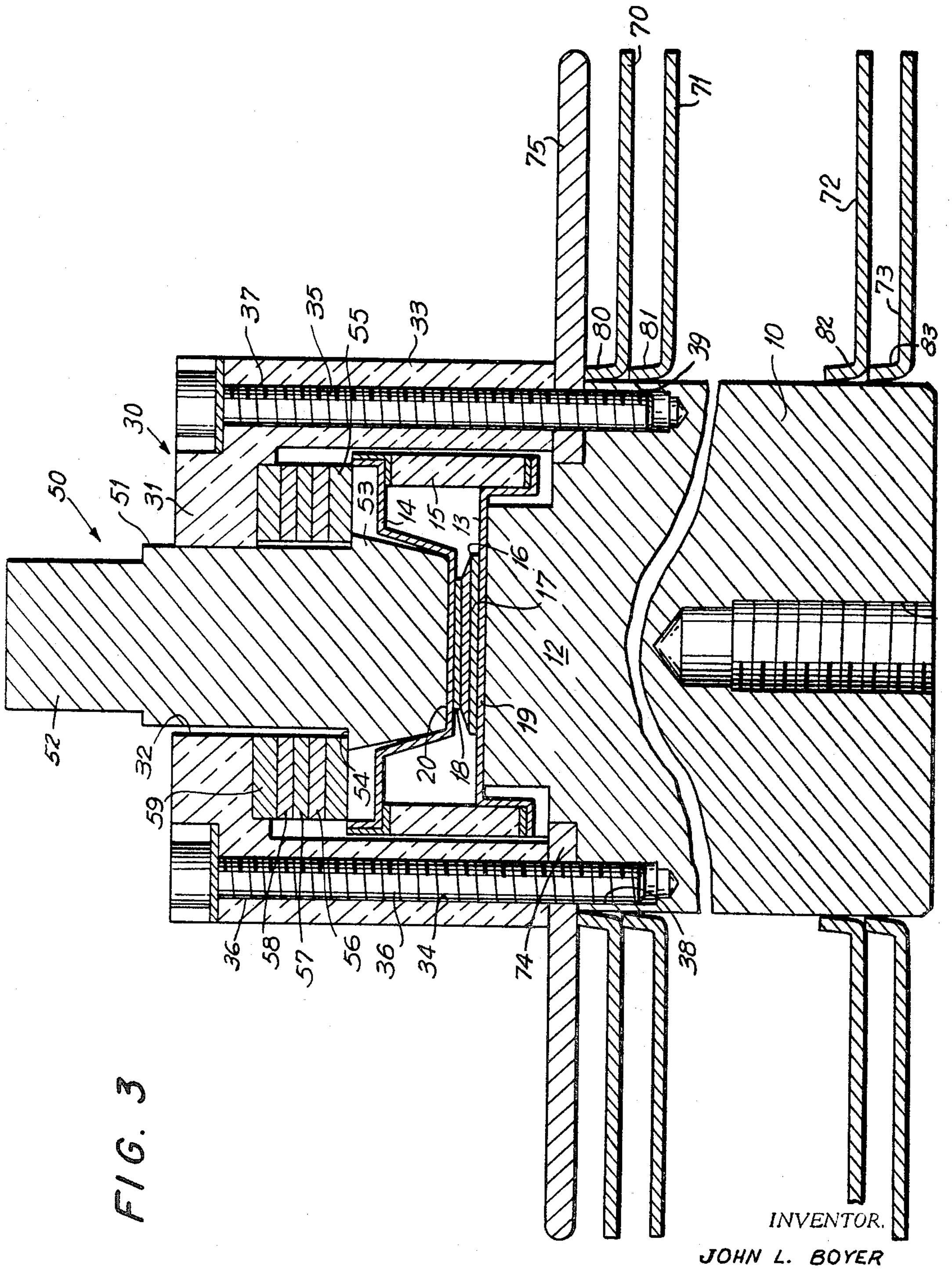
FIGURE 3 is a cross-sectional view of FIGURE 2 taken across the line 3—3 in FIGURE 2.

Referring now to the drawings and with special referenceence to FIGURE 3, there is illustrated therein a main support stud 10 having a threaded opening 11 therein which can receive a suitable mounting bolt. The main stud 10 has a raised platform section 12 which receives the lower dish-shaped header 13 of a semiconductor device assembly of the type described in copending application Ser. No. 546,360 filed Apr. 29, 1966 in the names of John L. Boyer and Richard A. Hartmann entitled "Compression Bonded Semiconductor Housing Construction" and assigned to the assignee of the present invention.

The lower conductive header 13 is connected to upper conductive header 14 by an insulation cylinder 15 to define a hermetically sealing enclosure for the semiconductor wafer 16 having opposing surfaces thereof. Note that expansion plates 17 and 18, which could be of molybdenum or some other suitable material having thermal expansion characteristics similar to those of silicon wafer 16, have different diameters, thus permitting the shaping of wafer 16 (which has one or more junctions therein) to permit the application of relatively high voltages to wafer 16.

Expansion plates 17 and 18 are in pressure contact with the relatively flat bottom sections 19 and 20 of dish-shaped headers 13 and 14 so that relative lateral movement is possible between plates 17 and 18 and bottom sections 19 and 20.

An insulation cup 30 is then provided which has a bottom section 31 having an opening 32 therein and having a plurality of axially directed openings distributed around the cylindrical wall 33 thereof. FIGURE 3 illustrates two typical openings 34 and 35 where six such openings may be distributed around the periphery of cylindrical wall 33.

Figure 2:
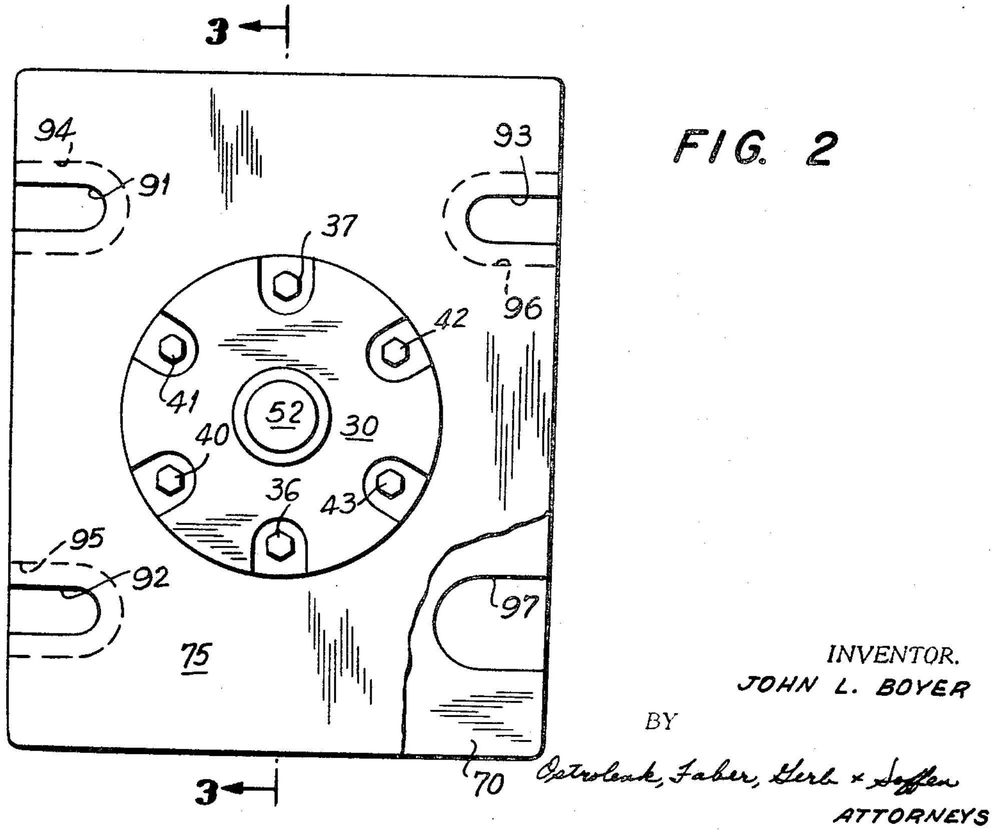
FIGURE 2 is a top plan view of FIGURE 1 with the upper plate partially broken away to illustrate the mounting slot in the first of a stack of cooling fins.

The upper surface of stud 10 then has a plurality of openings tapped therein in registry with the axially directed openings in cylindrical wall 33 so that the cup 30 can be bolted to stud 10. Two such bolts 36 and 37 are shown in FIGURE 3 extending through openings 34 and 35, respectively, and are threaded into threaded openings 38 and 39 in stud 10. A total of six bolts, the heads of each of which are flush with the upper surface of bottom 31 are shown in FIGURE 2 as bolts 36, 37, 40, 41, 42 and 43.

An adapter stud 50 having a circular shank portion 51 and a terminal connection portion 52 has the circular shank portion 51 passed through opening 32. Stud 50 has an enlarged head 53 defined by a shoulder 54 which shoulder 54 captures a stack of washers 55 through 59 between shoulder 54 and the bottom 31 of cup 30.

The washers 55 and 59 at the opposite ends of the stack may be flat steel washers, while the three interior washers 56, 57 and 58 are spring-type washers which tend to bias adapter stud 52 downwardly by their spring characteristic. The flat bottom of head 53 then bears against the upper surface of bottom member 20 of upper header 14, whereby the spring washers 56, 57 and 58 cause compression forces between head member 53 and the raised platform section 12 of stud 10 to capture the semiconductor device assembly with sufficient pressure to cause good electrical and mechanical contact between the housing assembly and the semiconductor device assembly.

It should be noted that the semiconductor device assembly composed of members 13 through 18 is a subassembly manufactured independently of the other components described herein. Therefore, the complete assembly of the device is extremely simple with the subassembly first laid atop raised platform 12 with the adapter stud 50 and washers 55 through 59 positioned between the bottom 31 of cup 30 and the adapter stud 50. Thereafter, the cup 30 is laid atop stud 10 and bolts such as bolts 34 and 35 are tightened to complete the assembly with the springs 56, 57 and 58 supplying the compressional forces required for good electrical and thermal connection of the semiconductor device assembly to the bulk conductive materials of stud 10 and adapter 50.

In accordance with a further feature of the invention, a novel integral heat sink arrangement is provided for stud 10 which consists of a plurality of flat spaced conductive fins such as fins 70, 71, 72 and 73 which are mounted around the periphery of the extending stud 10. Where this fin arrangement is to be used, the upper surface of stud 10 is provided with an annular depression 74 which has brazed therein a first conductive fin plate 75 of conductive material. Thereafter, each of fins 70 through 73, which have suitable openings therein conforming to the periphery of stud 10, are placed atop the stud and soldered thereto with a suitable soft solder.

In order to automatically provide spacing between the various fins which can be stacked to whatever number is desired and to provide a large area surface to provide maximum thermal connection between the fins and the stud 10, each of fins 70 through 73 are provided with upwardly turned interior flanges such as flanges 80, 81, 82 and 83. Flange 82 is shown in greater detail in FIGURE 4, and it will be seen that the flange is inwardly bent by a very slight amount such as some angle up to 5° to the axis of the plate.

The length of flange 82 will automatically determine the plate spacing so that it now becomes possible to immediately stack the plates atop stud 10 with the plates automatically having an appropriate spacing with respect to one another.

Figure 1:
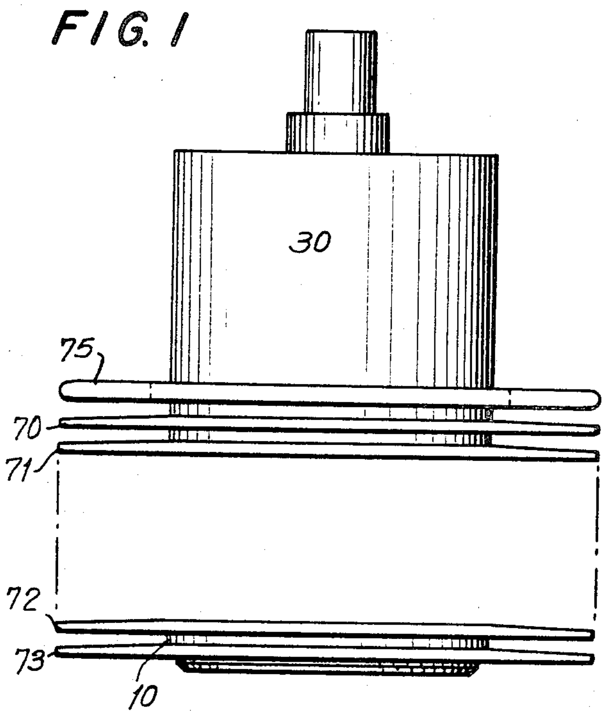
FIGURE 1 is a side plan view of the semiconductor device assembly of the invention.
Figure 4:
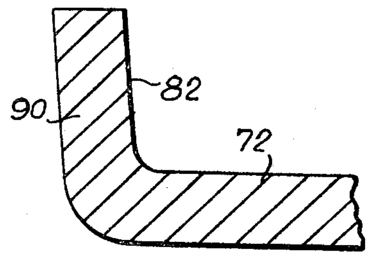
FIGURE 4 is an expanded view of the conductive fin flange for the flanges connected to the main stud of FIGURE 3.

Each of the plates can be soldered as it is assembled with the large area interior surface such as surface 90 of FIGURE 4 providing a relatively large area surface for connection to the periphery of stud 10. Alternatively, suitable solder rings can be assembled after each of the fins with the entire assembly of fins subsequently placed into a suitable soldering oven where they are each soldered simultaneously.

FIGURE 2 illustrates one manner in which the assembly may be mounted through the provision of first slots 91, 92, and 93 in the upper plate 75 and the provision of larger slots 94, 95, 96 and 97 in the first fin 70. This then permits an arrangement whereby a suitable mounting bolt can be easily connected to the support fins.

Although this invention has been described with respect to its preferred embodiments, it should be understood that many variations and modifications will now be obvious to those skilled in the art, and it is preferred, therefore, that the scope of the invention be limited not by the specific disclosure herein, but only by the appended claims.

The embodiments of the invention in which an exclusive privilege or property is claimed are defined as follows:

1. A semiconductor device assembly comprising a main support stud, an insulation cup, an adapter stud, a spring washer means and a semiconductor device; said insulation cup having a central opening through the bottom thereof; said adapter stud extending through said central opening; said spring washer means disposed in and engaging the bottom of said cup and surrounding said adapter stud; said adapter stud having an outwardly extending shoulder within the interior of said insulation cup; said spring washer means engaging said shoulder and biasing said adapter stud away from said bottom of said insulation cup; said insulation cup having a cylindrical wall extending from said bottom; said wall having a plurality of openings extending therethrough parallel to the axis of said cylindrical wall; the end of said cylindrical wall opposite said bottom engaging a surface of said main support stud; said surface of said main support stud having a plurality of tapped openings therein, respectively, in registry with said plurality of openings through said cylindrical wall; bolt means extending through said openings and threaded into said tapped openings to secure said insulation cup to said main support stud; said semiconductor device having first and second flat opposing surfaces defining first and second electrodes for said semiconductor device; said adaptor stud having a flat wafer receiving portion surface; said semiconductor device first and second flat opposing surfaces interposed between and respectively engaging said flat surface of said adapter stud and a centrally located region of said surface of said main support stud.

2. The device as set forth in claim 1 wherein said centrally located region of said surface of said main support stud is a raised portion.

3. The device as set forth in claim 1 wherein said main support stud is an elongated body extending downward from said surface; and a plurality of flat parallel conductive fins stacked around the periphery of said elongated body and electrically and mechanically connected thereto; each of said fins having a central opening having an upwardly bent flange; said fins spaced from one another by the axial length of said upwardly bent flanges.

4. The device as set forth in claim 1 wherein said semiconductor device comprises a wafer of semiconductor material, first and second dish-shaped headers of conductive material, and an insulation cylinder connected between the outer peripheries of said first and second dish-shaped headers; said first and second dish-shaped headers dished inwardly toward one another and terminating in relatively flat bottom sections; said wafer of semiconductor material interposed between said flat bottom sections of said first and second dish-shaped headers.

References Cited

UNITED STATES PATENTS

| | | | |
|---|---|---|---|
| 3,209,218 | 9/1965 | Zielasek et al. | 317—240 |
| 3,313,987 | 4/1967 | Boyer | 317—234 |

FOREIGN PATENTS

| | | |
|---|---|---|
| 980,558 | 1/1965 | Great Britain. |
| 1,011,171 | 11/1965 | Great Britain. |

JOHN W. HUCKERT, *Primary Examiner.*

J. SHEWMAKER, *Assistant Examiner.*